United States Patent
Yoon

(10) Patent No.: US 7,361,598 B2
(45) Date of Patent: Apr. 22, 2008

(54) METHOD FOR FABRICATING SEMICONDUCTOR DEVICE CAPABLE OF PREVENTING SCRATCH

(75) Inventor: Yang-Han Yoon, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 386 days.

(21) Appl. No.: 11/119,939

(22) Filed: May 3, 2005

(65) Prior Publication Data

US 2006/0141788 A1    Jun. 29, 2006

(30) Foreign Application Priority Data

Dec. 28, 2004   (KR) ...................... 10-2004-0113543

(51) Int. Cl.
 *H01L 21/302*    (2006.01)
 *H01L 21/461*    (2006.01)
(52) U.S. Cl. .............................. 438/689; 257/E21.244; 257/E21.249; 438/906; 438/697
(58) Field of Classification Search ................ 438/689, 438/692, 694, 697, 906; 257/E21.241, E21.244, 257/E21.245, E21.249
See application file for complete search history.

(56) References Cited

U.S. PATENT DOCUMENTS

| | | | |
|---|---|---|---|
| 5,907,762 A * | 5/1999 | Evans et al. ................... 438/3 |
| 6,881,687 B1 * | 4/2005 | Castrucci ..................... 438/795 |
| 7,074,702 B2 * | 7/2006 | Kim ........................... 438/597 |
| 7,220,600 B2 * | 5/2007 | Summerfelt et al. ........... 438/3 |
| 2001/0014498 A1 * | 8/2001 | Amico et al. ................ 438/243 |
| 2003/0013211 A1 * | 1/2003 | Hu et al. ....................... 438/4 |

FOREIGN PATENT DOCUMENTS

KR   10-2004-0049880    6/2004

* cited by examiner

*Primary Examiner*—Caridad Everhart
(74) *Attorney, Agent, or Firm*—McDermott Will & Emery LLP

(57) ABSTRACT

Disclosed is a method for fabricating a semiconductor device capable of preventing scratches. The method includes the steps of: forming a substrate divided into a peripheral region and a cell region where a capacitor including a metal plate electrode on which particles with a pointed shape are generated is formed; forming an inter-layer insulation layer with a poor step coverage on the metal plate electrode, the particles with the pointed shape and a surface of the substrate in the peripheral region; etching a portion of the inter-layer insulation layer, thereby exposing predetermined portions of lateral sides of the particles with the pointed shape; selectively removing the exposed portions of the particles with the pointed shape to separate top portions of the particles with the pointed shape from the inter-layer insulation layer; and planarizing the inter-layer insulation layer through a chemical mechanical polishing (CMP) process.

15 Claims, 4 Drawing Sheets

METHOD FOR FABRICATING SEMICONDUCTOR DEVICE CAPABLE OF PREVENTING SCRATCH

FIELD OF THE INVENTION

The present invention relates to a method for fabricating a semiconductor device; and more particularly, to a method for fabricating a semiconductor device capable of preventing scratches generated during a chemical mechanical polishing (CMP) process.

DESCRIPTION OF RELATED ARTS

As a scale of integration of a semiconductor device has increased, the need of forming a plurality of interconnection lines has been increased. To form the plurality of interconnection lines, a role of an inter-layer insulation layer is very important. The inter-layer insulation layer serves the role in insulating a bottom interconnection line and a top interconnection line from each other. A planarization of the inter-layer insulation layer greatly affects a planarization and a photolithography margin of a top layer to be subsequently formed.

Normally, a chemical mechanical polishing (CMP) process is mainly used for planarizing the inter-layer insulation layer. The method for planarizing the inter-layer insulation layer is performed by sticking a substrate having a height difference on a polishing pad and then polishing the substrate with use of slurry.

FIG. 1 is diagram briefly illustrating a conventional method for fabricating a semiconductor device.

As shown, a first inter-layer insulation layer 12 is formed on a substrate 11 divided into a cell region and a peripheral region. Then, a plurality of storage node contacts 13 connected to certain portions of the substrate 11 by passing through the first inter-layer insulation layer 12 are formed.

Subsequently, a second inter-layer insulation layer 14 is formed on the first inter-layer insulation layer 12. Afterwards, the second inter-layer insulation layer 14 is selectively etched, thereby forming a plurality of holes for forming storage nodes of capacitors. Then, a plurality of storage nodes 15 having a cylinder structure are formed inside of the above holes.

Next, a dielectric layer 16 is formed on the plurality of storage nodes 15 and then, a plate electrode 17 is formed on the dielectric layer 16. At this time, the plate electrode 17 and the dielectric layer 16 are selectively subjected to a patterning process, thereby being formed only in the cell region. Thus, capacitors are formed only in the cell region.

Next, a third inter-layer insulation layer 18 is deposited on a surface of the substrate 11 and the plate electrode 17. Afterwards, a CMP process is performed to reduce the height difference between the cell region and the peripheral region, thereby planarizing the third inter-layer insulation layer 18. Herein, the third inter-layer insulation layer 18 is formed by using tetraethylorthosilicate (PETOS). Continuously, a metal interconnection process is performed as a subsequent process to the CMP process.

The conventional method described above is applied with a capacitor with a metal-insulator-metal (MIM) structure to secure a sufficient amount of power supply. At this time, the plate electrode 17 of the capacitor is formed by sequentially stacking a polysilicon layer, a TiN layer formed by a physical vapor deposition, another TiN layer formed by a chemical vapor deposition (CVD) method.

However, the conventional method generates various defects when said anther TiN layer that is the top layer of the plate electrode 17 is deposited through performing the CVD method. Particularly, large particles 19A and 19B are generated during the deposition of the TiN layer by the CVD method. At this time, the large particles 19A and 19B are generated because TiN is deposited on lateral sides of a deposition chamber during depositing the TiN layer by the CVD method; and the TiN layer deposited on the lateral sides of the deposition chamber is separated from the chamber during moving a wafer, thereby sticking to a surface of the TiN layer formed by employing the CVD method. The large particles 19A and 19B are also generated in case of using a metal layer or a metal oxide layer as the plate electrode 17 in addition to the TiN layer.

Since the large particles 19A and 19B continuously exist even during a subsequent process, the large particles 19A and 19B are broken during performing the CMP process to the third inter-layer insulation 18, thereby causing scratches. Particularly, the large particle 19A having a more round shape does not have an influence on the generation of the scratches; however, another large particle 19B having a pointed shape becomes a main cause of generating the scratches.

Accordingly, during performing the CMP process to the third inter-layer insulation layer 18, the latter described large particle 19B with a pointed shape is broken as soon as the CMP process starts, thereby existing on a surface of the third inter-layer insulation layer 18. Since the latter described large particle 19B with the pointed shape is TiN that is a metal substance, this large particle 19B with the pointed shape is not polished during the CMP process performed by using the slurry for an oxide layer and generates scratches on the third inter-layer insulation layer 18.

As described above, the latter described large particle 19B with the pointed shape generates a lot of scratches until the CMP process finishes. These scratches provide a high possibility of forming a bridge during forming a subsequent metal interconnection line, thereby degrading yields of products.

As a result, the conventional method causes a lot of scratches since several large particles generated before the CMP process performed to the target inter-layer insulation layer are not polished and continuously remain. Thus, the conventional method brings out a problem of degrading the yields of semiconductor devices.

SUMMARY OF THE INVENTION

It is, therefore, an object of the present invention to provide a method for fabricating a semiconductor device capable of removing metal particles generated during depositing a plate electrode that cause scratches during a chemical mechanical polishing process with respect to a subsequent inter-layer insulation layer for reducing a height difference between a cell region and a peripheral region.

In accordance with one aspect of the present invention, there is provided a method for fabricating a semiconductor device, including the steps of: forming a substrate divided into a peripheral region and a cell region where a capacitor including a metal plate electrode on which particles with a pointed shape are generated is formed; forming an inter-layer insulation layer with a poor step coverage on the metal plate electrode, the particles with the pointed shape and a surface of the substrate in the peripheral region; etching a portion of the inter-layer insulation layer, thereby exposing predetermined portions of lateral sides of the particles with the pointed shape; selectively removing the exposed portions of the particles with the pointed shape to separate top portions of the particles with the pointed shape from the inter-layer insulation layer; and planarizing the inter-layer insulation layer through a chemical mechanical polishing (CMP) process for reducing a height difference between the cell region and the peripheral region.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on preferred embodiments of the present invention will be provided with reference to the accompanying drawings.

FIGS. 2A to 2E are cross-sectional views illustrating a method for fabricating a semiconductor device in accordance with the preferred embodiment of the present invention.

Figure 1:
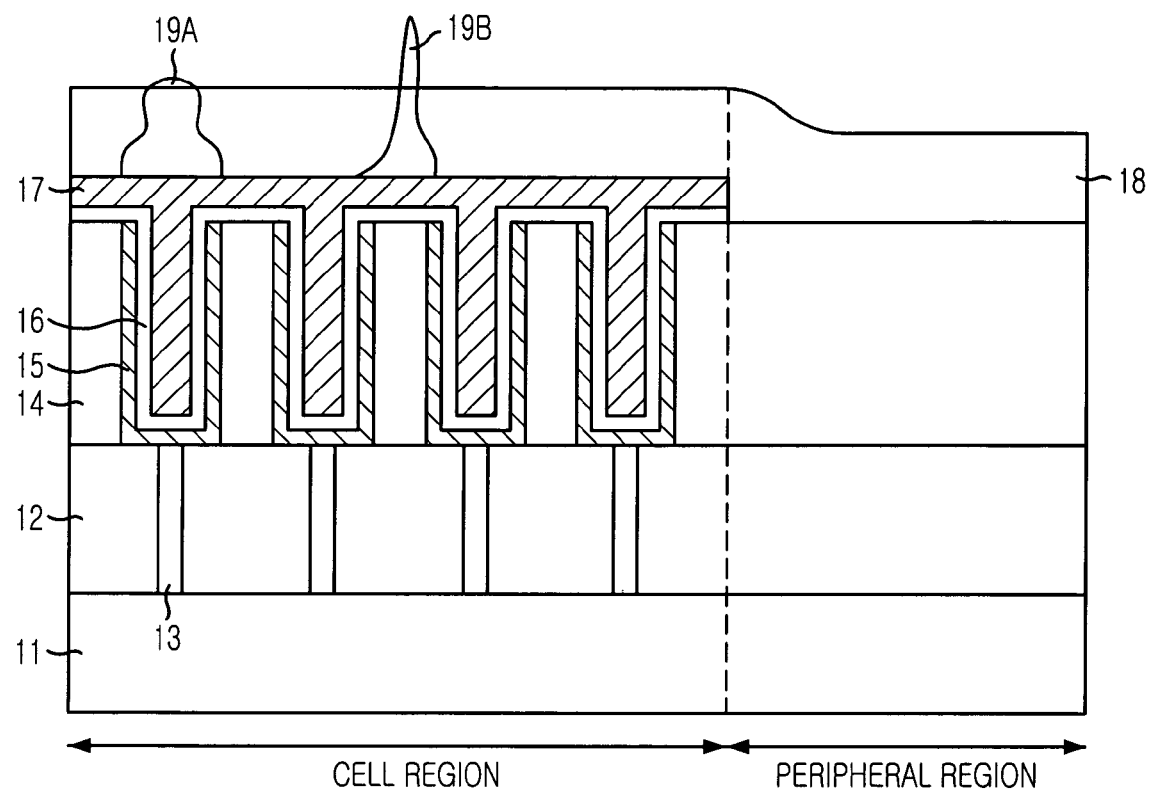
FIG. 1 is a diagram briefly illustrating a conventional method for fabricating a semiconductor device.
Figure 2A:
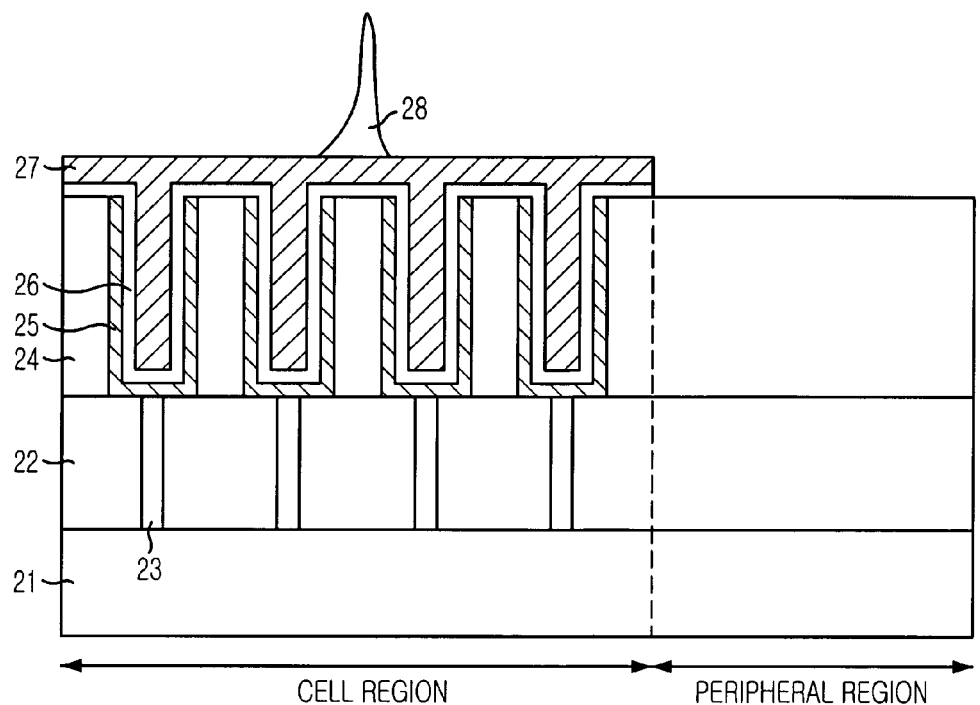
FIGS. 2A to 2E are cross-sectional views illustrating a method for fabricating a semiconductor device in accordance with the present invention.

Referring to FIG. 2A, a first inter-layer insulation layer 22 is formed on a substrate 21 divided into a cell region and a peripheral region. A plurality of storage node contacts 23 connected to predetermined portions of the substrate 21 by passing through the first inter-layer insulation layer 22 are formed.

Subsequently, before the first inter-layer insulation layer 22 is formed, as usually known, other device elements such as a transistor and a bit line are formed. Accordingly, the first inter-layer insulation layer 22 can be a multi-layer structure, and a plurality of landing plug contacts can be formed beneath the plurality of storage node contacts 23 in advance.

Although not illustrated, for the step of forming the plurality of storage node contacts 23, the first inter-layer insulation layer 22 is etched, thereby forming the plurality of storage node contact holes. Afterwards, a polysilicon layer or a tungsten layer is deposited until filling the plurality of storage node contact holes. Then, an etch-back process or a chemical mechanical polishing (CMP) process is employed. Thus, the plurality of neighboring storage node contacts 23 are separated from each other. Herein, in case of forming the plurality of storage node contacts 23 by using the polysilicon layer, a barrier metal can be inserted to provide respective ohmic contacts between the plurality of storage node contacts 23 and a plurality of storage nodes. In case of using the tungsten layer for forming the plurality of storage node contacts 23, the barrier metal also can be inserted. At this time, the barrier metal uses titanium silicide ($TiSi_2$), and the employed $TiSi_2$ provides the ohmic contacts between the plurality of storage node contacts 23 and a plurality of subsequent storage nodes, thereby improving a contact resistance property.

As described above, after the plurality of storage node contacts 23 are formed, a second inter-layer insulation layer 24 is formed on the first inter-layer insulation layer 22. Afterwards, the second inter-layer insulation layer 24 is selectively etched, thereby forming a plurality of holes for use in storage nodes of capacitors. Then, a storage node separation process is performed and as a result, a plurality of storage nodes 25 having a cylinder structure are formed inside of the plurality of holes. Herein, the second inter-layer insulation layer 24 is formed by stacking a phosphosilicate-glass (PSG) layer and a plasma enhanced tetraethylorthosilicate (PETEOS) layer. The PSG layer is stacked in a thickness of approximately 7,000 Å, and the PETEOS layer is stacked in a thickness of approximately 16,000 Å.

For the storage node separation process, a metal layer selected from a group consisting of titanium (Ti), titanium nitride (TiN), hafnium nitride (HfN), vanadium nitride (VN), tungsten (W), tungsten nitride (WN), platinum (Pt), ruthenium (Ru), ruthenium oxide ($RuO_2$), iridium (Ir), iridium oxide ($IrO_2$), rhodium (Rh) and palladium (Pd) is deposited on the second inter-layer insulation layer 24 provided with the plurality of holes in a thickness ranging from approximately 20 Å to approximately 300 Å. At this time, the metal layer is deposited through employing a method selected from a group consisting of a physical vapor deposition (PVD) method, a chemical vapor deposition (CVD) method, an atomic layer deposition (ALD) method and an electroplating method.

Subsequently, the metal layer remaining on the top surface of second inter-layer insulation layer 24 is removed through the aforementioned CMP process or the aforementioned etch-back process, thereby forming the plurality of storage nodes 25 having the cylinder structure inside of the plurality of holes. At this time, there is a possibility that impurities such as abrasives and etched particles are stuck to an inner surface of the cylinder structure when the metal layer is removed. Thus, it is preferable to fill the inside of the plurality of holes with a photoresist and then, to perform the CMP process or the etch-back process until exposing the surface of the second inter-layer insulation layer 24. Afterwards, the photoresist inside of the plurality of holes is removed by ashing.

As described above, after forming the plurality of storage nodes 25, a dielectric layer 26 is formed on the plurality of storage nodes 25 and the exposed surface of the second inter-layer insulation layer. Afterwards, a plate electrode 27 is formed on the dielectric layer 26. At this time, the plate electrode 27 and the dielectric layer 26 are selectively subjected to a patterning process, thereby being formed only in the cell region. Accordingly, capacitors are formed in the cell region.

Meanwhile, the dielectric layer 26 is formed by a material selected from a group consisting of silicon oxide ($SiO_2$), Silicon nitride ($Si_3N_4$), oxygen nitroxide (ONO), tantalum oxide ($Ta_2O_5$), aluminum oxide ($Al_2O_3$), titanium oxide ($TiO_2$) and hafnium oxide ($HfO_2$). The plate electrode 27 is formed by sequentially stacking a polysilicon layer, a first TiN layer formed by employing a PVD method and a second TiN layer formed by employing a CVD method.

As a result, each of the capacitors is formed in a metal-insulator-metal (MIM) structure, wherein the plurality of storage nodes and the plate electrodes of the capacitors have a metal layer structure.

Meanwhile, the plate electrode 27 can be formed by using a metal layer or a metal oxide layer selected from a group consisting of Ti, TiN, HfN, VN, W, WN, Pt, Ru, $RuO_2$, Ir, $IrO_2$, Rh and Pd.

Large particles are also generated on a surface of the plate electrode 27 as the large particles are also generated after the plate electrode 27 is formed like the conventional method. For instance, a particle with a round shape and a particle with a pointed shape are generated. Hereinafter, the particle with the round shape is not illustrated since the particle with the round shape does not have an influence on generation of scratches during a subsequent CMP process and only the particle with the pointed shape is illustrated and explained. The latter described particle with the pointed shape is denoted with a reference numeral 28. Herein, although many particles with a pointed shape are generated, only one particle with a pointed shape is illustrated for the simple explanation.

Figure 2B:
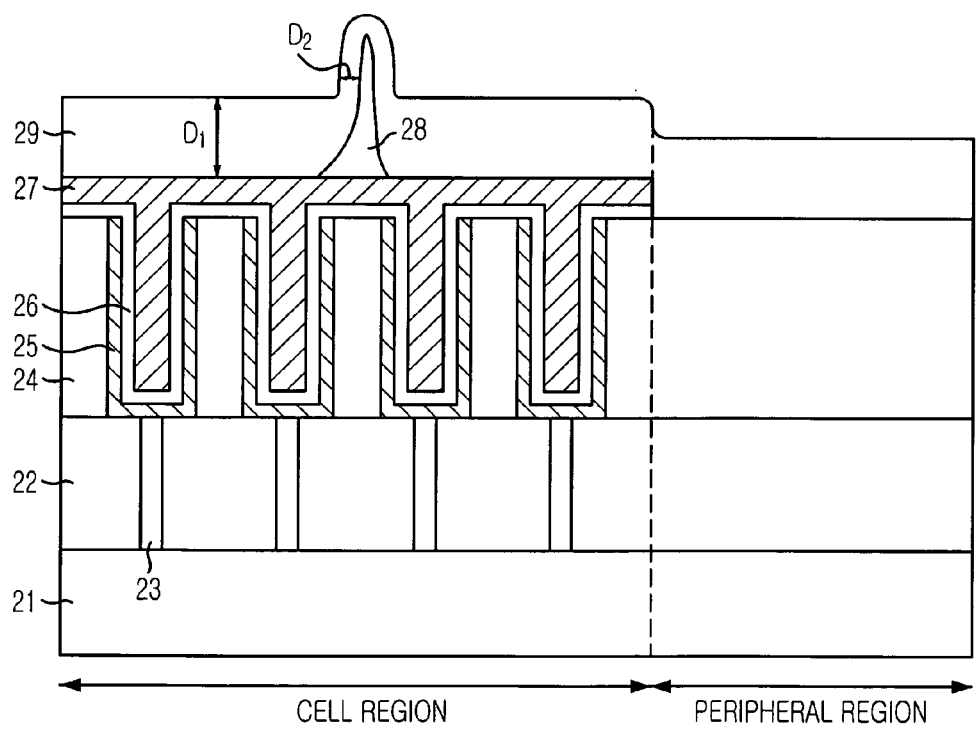

Referring to FIG. 2B, a third inter-layer insulation layer 29 is deposited on the plate electrode 27 where the particle with the pointed shape 28 is generated and a surface of the second inter-layer insulation layer 24.

At this time, the third inter-layer insulation layer 29 is formed by using a silane ($SiH_4$)-based oxide layer with a poor step coverage, e.g., an undoped-silicate-glass (USG) layer, or a PETEOS layer. Herein, in case of using the PETEOS layer, a deposition condition is controlled to deteriorate the step coverage.

For instance, the poor step coverage means that the third inter-layer insulation layer 29 is deposited in a very thick deposition thickness (D1) on an upper surface of the planarized plate electrode 27 and in a very thin deposition thickness (D2) on lateral surfaces of a projected bottom structure such as the particle 28 with the pointed shape. That is, the poor step coverage means that the deposition thickness becomes different according to the shape of the bottom structure even though the third inter-layer insulation layer 29 is deposited in the same condition.

As described above, in case of using the $SiH_4$-based oxide layer, the deposition is speeded up to make the third inter-layer insulation layer 29 have the poor step coverage, and in case of using the PETEOS layer, the step coverage is controlled by reducing an amount of ozone ($O_3$).

At this time, various other parameters except the deposition speed and the amount of $O_3$ are also controlled to control the step coverage of the third inter-layer insulation layer 29 below approximately 40%.

For instance, the third inter-layer insulation layer 29 is deposited in a temperature ranging from approximately 300° C. to approximately 500° C. In order to make the step coverage of the PETEOS layer poor, the third inter-layer insulation layer 29 is deposited by controlling the amount of $O_3$, an amount of a TEOS layer, a power, a pressure, a spacing distance between a wafer and a heater. In order to make the step coverage of $SiH_4$-based oxide layer poor, the third inter-layer insulation layer 29 is deposited by controlling amounts of $SiH_4$, oxygen ($O_2$), nitrous oxide ($N_2O$) and nitrogen ($N_2$), a power, a pressure and a spacing distance between a wafer and a heater. For instance, in order for the $SiH_4$-based oxide layer to have the poor step coverage, an amount of a reaction gas decreases; a pressure of a deposition chamber increases, thereby making the reaction gas flow much more; the spacing distance between the wafer and the heater gets smaller; and a low chamber temperature is maintained.

Figure 2C:
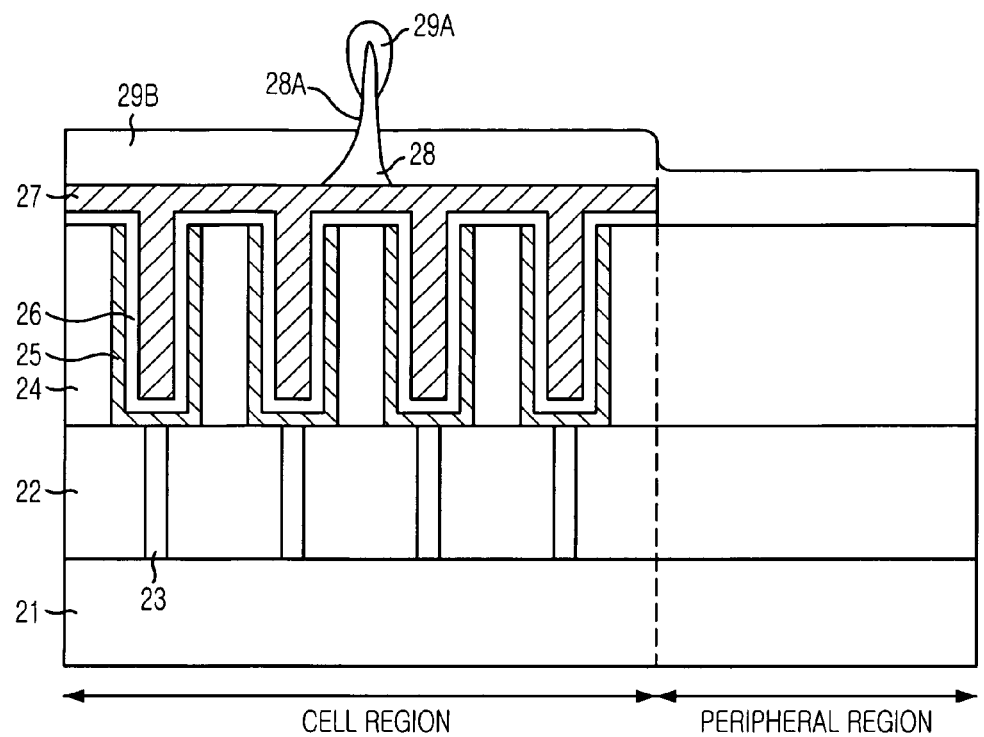

Referring to FIG. 2C, after completing the deposition of the third inter-layer insulation layer 29, a wet etching followed with a chemical etching partially performed to the third inter-layer insulation layer 29 or a dry chemical etching is employed to lower the thickness of the third inter-layer insulation layer 29.

For instance, the wet etching of the third inter-layer insulation layer 29 is performed by dipping the substrate in a wet bath. At this time, the wet etching uses hydrogen fluoride (HF) or a buffered oxide etchant (BOE). The wet etching etches the third inter-layer insulation layer 29 in a target of obtaining a half thickness of the first deposition thickness, i.e., a thickness equal to or less than approximately 3,000 Å. Meanwhile, the dry chemical etching of the third inter-layer insulation layer 29 uses a fluorine-based gas. For instance, tetrafluoromethane ($CF_4$) or octafluorocyclobutane ($C_4F_8$) is used.

Through the partial etching of the third inter-layer insulation layer 29, a height of the third inter-layer insulation layer 29 is lowered. Herein, the third inter-layer insulation layer 29 remains not only in a first shape 29A covering a top portion and lateral portions of the particle 28 with the pointed shape because of an isotropic etching property that is an unique property of the chemical etching but also in a second shape 29B covering the surface of the plate electrode 27 and lateral sides of a bottom portion of the particle 28 with the pointed shape. Accordingly, the third inter-layer insulation layer 29 remains in the first shape 29A and the second shape 29B. The first shape 29A and the second shape 29B are separated from each other in a discontinuous layer, thereby exposing certain lateral portions of the particle 28 with the pointed shape.

As described above, through the partial chemical etching performed to the third inter-layer insulation layer 29, the certain lateral portions 28A of the particle 28 with the pointed shape are exposed and thus, a providing space that a chemical or an etching gas can penetrate to the lateral portions 28A of the particle 28 with the pointed shape during a subsequent etching process.

Figure 2D:
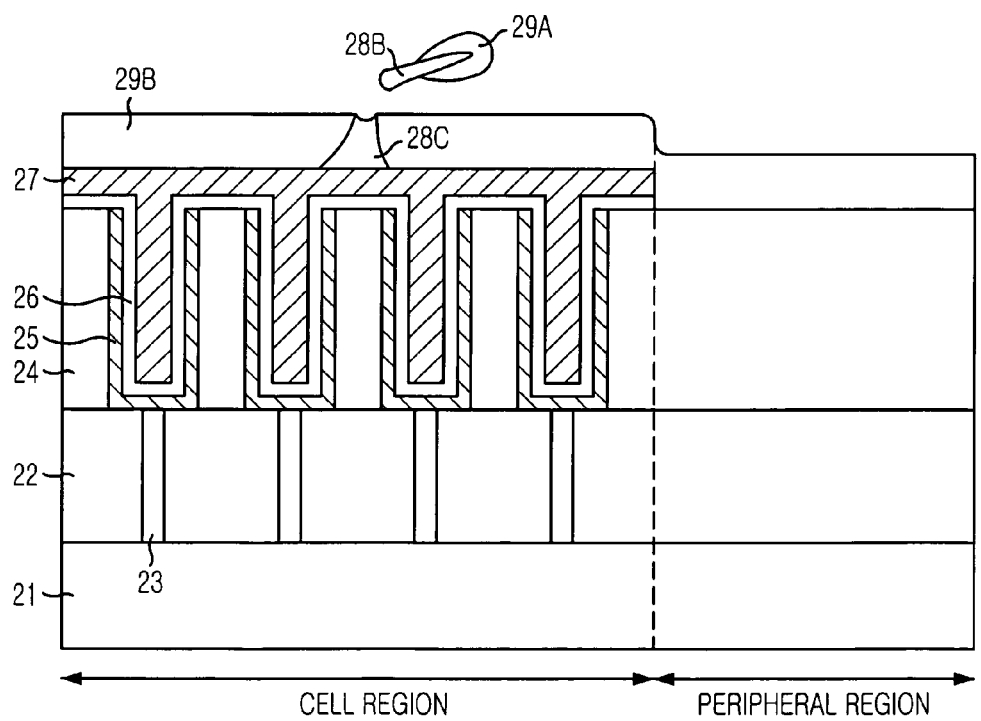

Referring to FIG. 2D, the particle 28 with the pointed shape is etched by using a chemical capable of etching TiN wherein is used for forming the particle 28 with the pointed shape.

At this time, the etching of the particle 28 with the pointed shape is performed by dipping the substrate 21 in a wet bath as like the wet etching of the third inter-layer insulation layer 29. Also, the particle 28 with the pointed shape can be etched by employing a dry etching. At this time, the particle 28 with the pointed shape is controlled to be etched in a thickness equal to or less than approximately 7,000 Å.

First, the wet etching uses a mixed solution of sulfuric acid ($H_2SO_4$) and hydrogen peroxide ($H_2O_2$) or a mixed solution of ammonium hydroxide ($NH_4OH$), $H_2O_2$ and deionized water (DI). Furthermore, in case of the dry etching, a chlorine-based gas such as chlorine ($Cl_2$) capable of etching TiN is used.

As described above, the particle 28 with the pointed shape is removed through the wet etching or the dry etching. As the mixed solution or the etching gas penetrates into the exposed lateral portions 28A of the particle 28 with the pointed shape, the particle 28 with the pointed shape is etched. Accordingly, as the exposed lateral portions 28A are etched, a top portion 28B of the particle 28 with the pointed shape is broken and separated from the second shape 29B. At this time, when the top portion 28B of the particle 28 with the pointed shape is broken, the first shape 29A of the third inter-layer insulation layer 29 covering the top portion 28B of the particle 28 with the pointed shape is also separated.

Since the top portion 28B of the particle 28 with the pointed shape covered with the first shape 29A of the third inter-layer insulation layer 29 is broken and separated, a bottom portion 28C of the particle 28 with the pointed shape is recessed in an inward direction to the second shape 29B of the third inter-layer insulation layer 29.

Figure 2E:
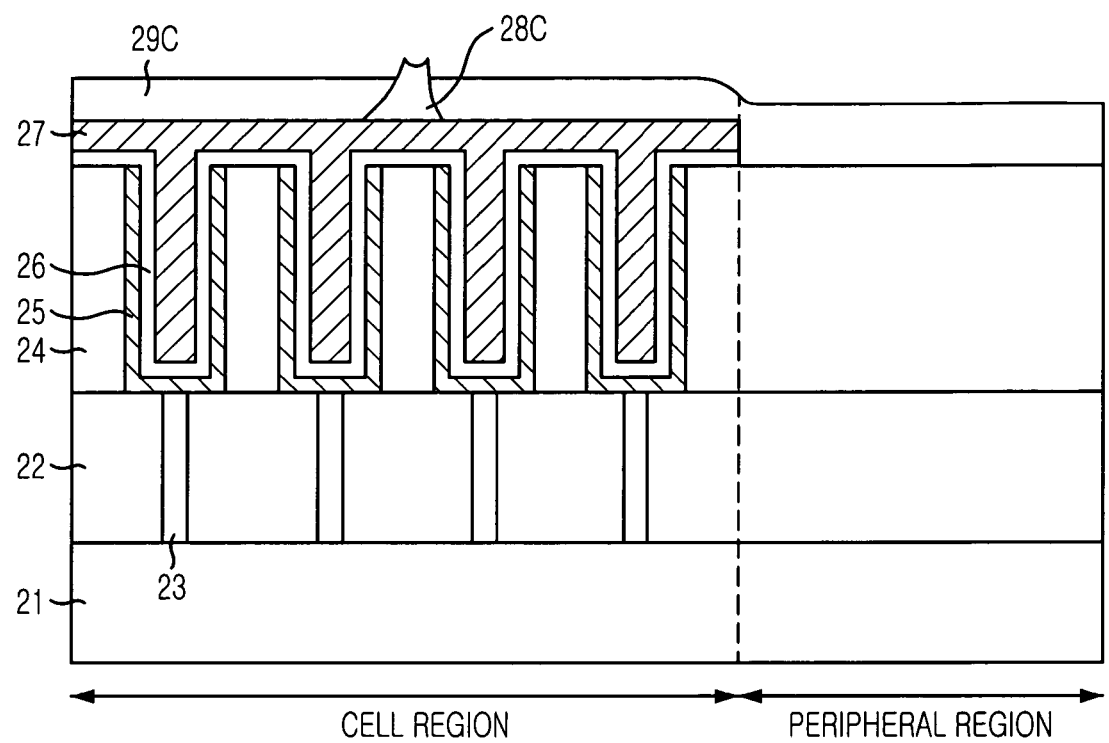

Referring to FIG. 2E, a cleaning process or a scrubbing process is employed to remove the top portion 28B of the particle 28 with the pointed shape and the first shape 29A of the separated third inter-layer insulation layer 29.

Next, a CMP process is performed by using slurry for an oxide layer for the purpose of reducing a height difference between the cell region and the peripheral region. At this time, the CMP process is performed with respect to the second shape 29B of the third inter-layer insulation layer 29. A planarized third inter layer insulation layer is denoted with a reference numeral 29C, and the height difference between the cell region and the peripheral region is reduced because o the CMP process. At this time, a top portion of the bottom portion 28C of the particle 28 with the pointed shape can be partially projected in an upward direction; however, since the projected shape is no longer pointed, scratches are not generated.

During the CMP process, since the particle 28 made of TiN and being a source of the scratches is no longer sharply pointed, the scratches are not generated. That is, since the sharply pointed ledged particle 28 made of TiN that could be broken during the CMP process does not exist, the scratches are not generated.

Accordingly, there is not degradation of yields of semiconductor devices caused by a bridge generated between metal interconnection lines. Furthermore, since the commonly employed CMP process using the slurry for the oxide layer is applied, an additional investment cost is not required.

In summary, according to the preferred embodiment of the present invention, a portion of the particle with the pointed shape being generated during depositing the plate electrode and being a source of scratches is removed and thus, the scratches are not generated during a CMP process. Therefore, there is not degradation of yields of semiconductor devices caused by a bridge formed between metal interconnection lines. As a result, it is also possible to improve reliability.

The present application contains subject matter related to the Korean patent application No. KR 2004-113543, filed in the Korean Patent Office on Dec. 28, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
    forming a substrate divided into a peripheral region and a cell region where a capacitor including a metal plate electrode on which particles with a pointed shape are generated is formed;
    forming an inter-layer insulation layer with a poor step coverage on the metal plate electrode, the particles with the pointed shape in the cell region and a surface of the substrate in the peripheral region wherein the shape of the inter-layer insulation layer is dependent upon the shape of the particles with the pointed shape;
    etching a portion of the inter-layer insulation layer to expose lateral sides of the particles with the pointed shape;
    selectively removing the exposed portions of the particles with the pointed shape to separate top portions of the particles with the pointed shape from the inter-layer insulation layer; and
    planarizing the inter-layer insulation layer through a chemical mechanical polishing (CMP) process for reducing a height difference between the cell region and the peripheral region.

2. The method of claim 1, wherein prior to the step of performing the CMP process for reducing the height difference between the cell region and the peripheral region, one of a cleaning process and a scrubbing process for removing the particles with the pointed shape separated from the inter-layer insulation layer is performed.

3. The method of claim 1, wherein the metal plate electrode is formed by using one of a metal layer and a metal oxide layer selected from a group consisting of titanium (Ti), titanium nitride (TiN), hafnium nitride (HfN), vanadium nitride (VN), tungsten (W), tungsten nitride (WN), platinum (Pt), ruthenium (Ru), ruthenium oxide ($RuO_2$), iridium (Ir), iridium oxide ($IrO_2$), rhodium (Rh) and palladium (Pd).

4. The method of claim 1, wherein the inter-layer insulation layer covers the shape of the particles with the pointed shape.

5. The method of claim 1, wherein the exposed portion of the particles with the pointed shape is selectively removed by using a wet etching process.

6. The method of claim 5, wherein the wet etching process uses one of a mixed solution of sulfuric acid ($H_2SO_4$) and hydrogen peroxide ($H_2O_2$) and a mixed solution of ammonium hydroxide ($NH_4OH$), $H_2O_2$ and deionized water (DI).

7. The method of claim 1, wherein the exposed portions of the particles with the pointed shape is selectively removed by using a dry etching process.

8. The method of claim 7, wherein the dry etching process uses a chlorine ($Cl_2$)-based gas.

9. The method of claim 1, wherein the inter-layer insulation layer with the poor step coverage is made of a silane ($SiH_4$)-based oxide layer.

10. The method of claim 9, wherein the $SiH_4$-based oxide layer is deposited under the condition of a reduced amount of a reaction gas, an increased pressure of a deposition chamber which, in turn, increases a flow of the reaction gas, decreases a spacing distance between a wafer and a heater, and maintains a chamber at a low chamber temperature.

11. The method of claim 1, wherein the inter-layer insulation layer with the poor step coverage is made of a plasma enhanced tetraethylorthosilicate (PETEOS) layer.

12. The method of claim 11, wherein the PETEOS layer is deposited under the condition of a reduced amount of a reaction gas, an increased pressure of a deposition chamber which, in turn, increases a flow of the reaction gas, decreases a spacing distance between a wafer ad a heater, and maintains a chamber at a low temperature.

13. The method of claim 1, wherein the step of etching the portion of the inter-layer insulation layer to expose the predetermined portions of the later sides of the particles with the pointed shape is carried out by employing one of a wet etching process and a dry chemical etching process.

14. The method of claim 13, wherein the wet etching process uses one of hydrogen fluoride (HF) and a buffered oxide etchant (BOE).

15. The method of claim 13, wherein the dry chemical etching process uses a fluorine-based gas.

* * * * *